United States Patent [19]
Hanz et al.

[11] Patent Number: 5,184,095
[45] Date of Patent: Feb. 2, 1993

[54] CONSTANT IMPEDANCE TRANSITION BETWEEN TRANSMISSION STRUCTURES OF DIFFERENT DIMENSIONS

[75] Inventors: Curtis L. Hanz, Redondo Beach; Jon J. Gulick, Hawthorne; Kathleen L. Virga, Redondo Beach; Allen Podell, Palo Alto, all of Calif.

[73] Assignee: Hughes Aircraft Company, Los Angeles, Calif.

[21] Appl. No.: 739,009

[22] Filed: Jul. 31, 1991

[51] Int. Cl.$^5$ .................................. H01P 5/00
[52] U.S. Cl. .................................. 333/33; 333/238; 333/246
[58] Field of Search ............... 333/33, 238, 246, 247

[56] References Cited

U.S. PATENT DOCUMENTS 3,634,789  1/1972  Stuckert .................. 333/238 X
4,899,118  2/1990  Polinski, Sr. .............. 333/246

Primary Examiner—Paul Gensler
Attorney, Agent, or Firm—Leonard A. Alkov; Wanda K. Denson-Low

[57] ABSTRACT

A microstrip transmission line structure a series of connected microstrip strip sections having different widths disposed on an outside layer of a unitized multilayer circuit structure and forming a microstrip line, respective ground planes for each of the strip sections formed between insulating layers of the untilized multilayer circuit structure and respectively spaced from the associated strip sections to provide a substantially constant impedance along the length of the microstrip line, and a plurality of conductive vias for electrically interconnecting the respective ground planes.

7 Claims, 2 Drawing Sheets

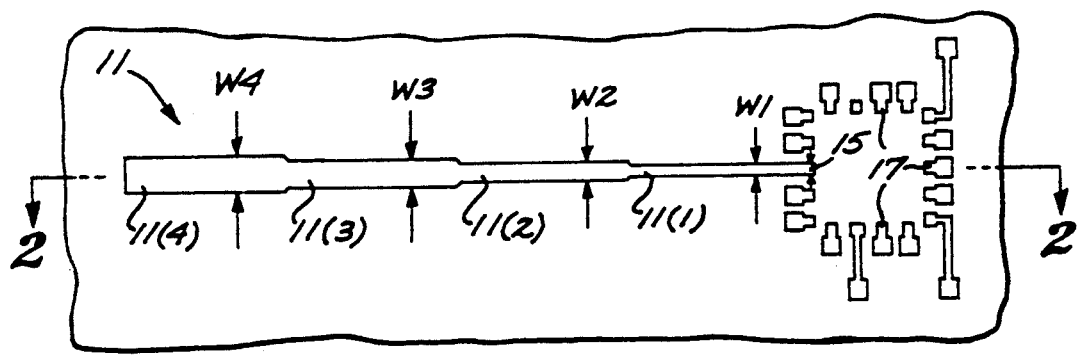
FIG. 1
FIG. 2
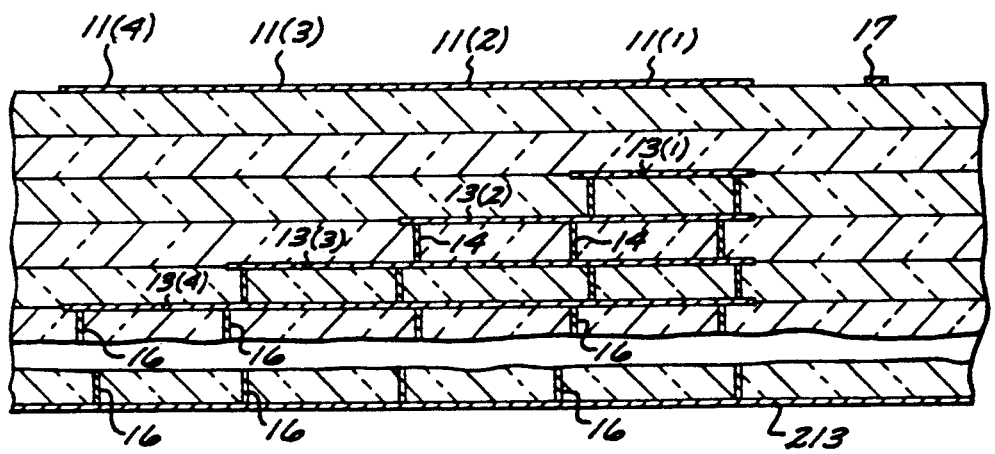
FIG. 3
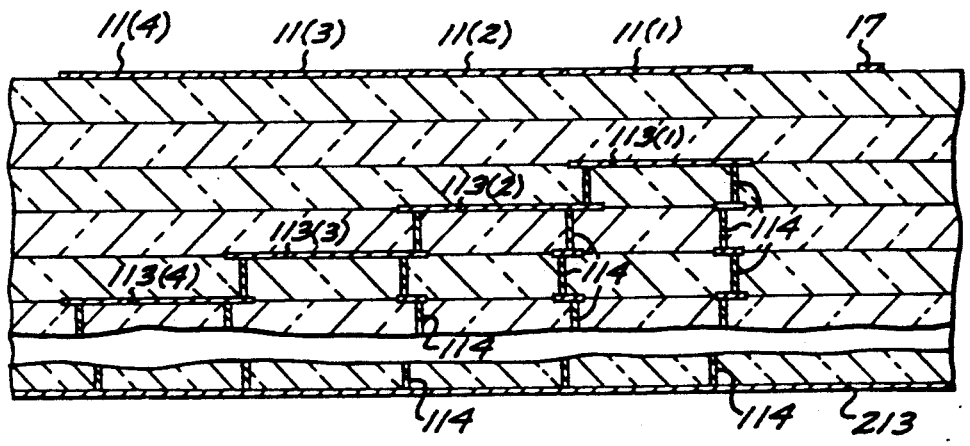

CONSTANT IMPEDANCE TRANSITION BETWEEN TRANSMISSION STRUCTURES OF DIFFERENT DIMENSIONS

BACKGROUND OF THE INVENTION

The disclosed invention is directed generally to hybrid multilayer circuit structures, and is directed more particularly to connected microstrip transmission lines of different dimensions disposed on hybrid multilayer circuit structures and having a substantially constant impedance.

Hybrid multilayer circuit structures, also known as hybrid microcircuits, implement the interconnection and packaging of circuit devices (e.g., integrated circuits), and generally include a unitized multilayer circuit structure formed from a plurality of integrally fused insulating layers (e.g., ceramic layers) having conductor traces disposed therebetween. The circuit devices are commonly mounted on the top insulating layer so as not to be covered by another insulating layer or on an insulating layer having die cutouts formed thereon to provide cavities for the circuit devices. Passive components such as capacitors and resistors can be formed on the same layer that supports the circuit devices, for example, by thick film processes, or they can be formed between the insulating layers, for example, also by thick film processes. Electrical interconnection of the conductors and components on the different layers is achieved with vias or holes appropriately located and formed in the insulating layers and filled with conductive via fill material, whereby the conductive material is in contact with predetermined conductive traces between the layers that extend over or under the vias.

Hybrid multilayer circuit structures are now being utilized for RF applications wherein microwave integrated circuits (MICs) and/or monolithic microwave integrated circuits (MMICs) mounted on a hybrid are interconnected by microstrip transmission structures formed on the multilayer structure, for example pursuant to screen printing or metal deposition.

A consideration with implementing microstrip transmission structures in hybrid multilayer circuit structures is the desirability of reducing signal reflection at the transitions between microstrip lines of different widths, where a variable width is being utilized for considerations such as reducing loss, layout requirements and processing requirements.

SUMMARY OF THE INVENTION

It would therefore be an advantage to provide low-reflection transitions between transmission structures of different dimensions.

The foregoing and other advantages are provided by the invention in a transmission line structure having a substantially constant characteristic impedance along its length so that reflections due to impedance change are negligible, whereby the total signal reflection is reduced. An illustrative embodiment of a microstrip transmission line structure in accordance with the invention includes a series of connected microstrip strip sections having different widths forming a microstrip line on the top layer of a unitized multilayer circuit structure, respective ground planes for each of said strip sections formed between insulating layers of the multilayer circuit structure respectively dielectrically spaced from the associated strip sections to provide a substantially constant impedance along the length of the microstrip line, and a plurality of conductive vias for electrically interconnecting the respective ground planes.

BRIEF DESCRIPTION OF THE DRAWINGS

The advantages and features of the disclosed invention will readily be appreciated by persons skilled in the art from the following detailed description when read in conjunction with the drawing wherein:

FIG. 1 is a top plan view of a portion of a unitized multilayer circuit structure in which is implemented a microstrip transmission line structure in accordance with the invention.

FIG. 2 is a sectional view illustrating the stepped ground planes of the microstrip transmission line structure of FIG. 1.

FIG. 3 is a sectional view illustrating a further stepped ground plane structure for the microstrip line of FIG. 1.

DETAILED DESCRIPTION OF THE DISCLOSURE

Figure 4:
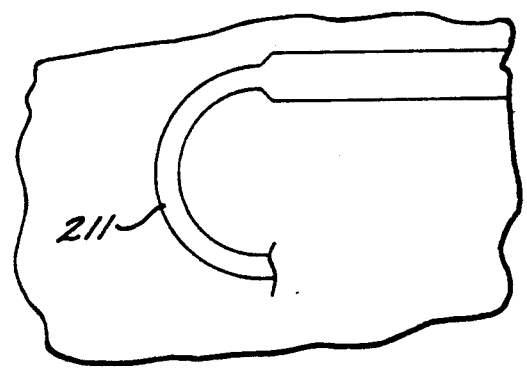
FIG. 4 is a top plan view of a curved microstrip section that can be utilized in the microstrip transmission line of the invention.

In the following detailed description and in the several figures of the drawing, like elements are identified with like reference numerals.

A microstrip transmission line structure in accordance with the invention is implemented in a unitized multilayer circuit structure that is utilized for interconnecting various circuit devices such as MICs and/or MMICs mounted on the outside of the unitized structure. The unitized multilayer circuit structure is formed from a plurality of insulating layers (comprising ceramic, for example), conductive traces disposed between the layers and on the top layer (including for example microstrip lines), and conductive vias formed in the layers which together with any buried elements (e.g., elements formed on the top of an insulating layer and covered by an overlying insulating layer) are processed to form an integrally fused unitized multilayer structure. After the unitizing fabrication, appropriate metallization is applied to the outside of the unitized structure, and the circuit devices are mounted and electrically connected.

Referring now to FIGS. 1 and 2, set forth therein is a top plan view and an elevational sectional view of a microstrip transmission line structure that includes a stepped microstrip line 11 disposed on the top layer of the multilayer circuit structure with which the transmission line structure is implemented. The microstrip line 11 includes a series of interconnected strip sections of respective fixed widths. Each fixed width strip section can comprise, for example, a linear strip section, a curved strip section or a section containing a bend.

For ease of illustration and explanation, the specific example will be discussed of a stepped microstrip line having fixed width linear strip sections 11(2), 11(3) 11(4) of different fixed widths W1, W2, W3, W4. The widths of the linear strip sections increase from right to left, and by way of example, the narrowest strip section 11(1) is connected to a chip bonding pad 15 that is of about the same width as the strip section 11(1). Further chip bonding pads 17 together with the chip bonding pad 15 can be utilized for connection to a MMIC, for example.

The microstrip transmission line structure further includes embedded ground plane metallization layers 13(1), 13(2), 13(3), 13(4) formed between different insulating layers and respectively associated with the different segments of the microstrip line, with the ground plane spacing being greater for greater strip section width. Each ground plane is at a fixed spacing relative to its associated strip section, with no intervening ground planes or conductive elements between a strip section and the portion of its associated ground plane that is directly beneath the strip section. The strip section widths and associated ground plane spacings are selected to provide for the same characteristic impedance for all of the strip sections, which provides a substantially constant impedance along the length of the line. To the extent that the bonding pad 15 is an extension of the strip section 11(1), the associated ground plane 13(1) should extend beneath the bonding pad 15.

For the illustrative example of having a MMIC bonded to the bonding pads 15, 17, the embedded ground planes should not extend to areas beneath the area enclosed by the bonding pads, so as to minimize the effect on the performance of the MMIC.

Since the ground plane spacings are constrained to be integral multiples of the thickness of each of the layers of the multilayer circuit structure, the specific line widths are dependent upon the ground plane spacings. In terms of implementation, an initial approximation for a particular strip section width would be utilized to determine a specific ground plane location, which in turn would define the specific line width that would need to be utilized, given a particular dielectric constant.

The ground planes are stepped such that the each of the ground planes extends beneath overlying ground planes to one end of the microstrip line, and the lowermost ground plane extends the entire length of the microstrip transmission line. The embedded ground planes are electrically interconnected by conductive vias 14, and the interconnected embedded ground plane structure is electrically connected by columns of conductive vias 16 to a bottom ground plane 213 formed on the lower surface of the unitized multilayer circuit structure in which the microstrip transmission line structure is implemented. Each column can comprise axially aligned vias or staggered vias which are interconnected with conductor traces or catch pads, as for example disclosed in commonly assigned U.S. Pat. No. 4,899,118, Feb. 6, 1990, incorporated herein by reference. Whether axially aligned vias or staggered vias are utilized depends on factors such as those affecting the electrical, thermal, or mechanical integrity of the unitized multilayer circuit structure. It should be appreciated that a generous amount of conductive vias has been utilized and arranged in parallel so as to reduce the inductive effects of the vias.

While the lowest ground plane of the stepped microstrip transmission line structure has been shown as an embedded ground plane, such lowest ground plane can comprise the bottom ground plane of the multilayer circuit structure, depending upon factors such as the width of the widest strip section widths and the number of layers in the unitized multilayer circuit structure.

Referring now to FIG. 3, set forth therein is a further embodiment of a microstrip transmission line structure in accordance with the invention configuration wherein the ground planes 113(1), 113(2), ... 113(4) extend only slightly beneath an immediately overlying embedded ground plane. The embedded ground planes are electrically connected to each other and to a bottom ground plane 213 by conductive vias 114 which can be arranged in columns for connections that extend through more than one insulating layer. Each column of conductive vias can comprise axially aligned vias or staggered vias which are interconnected with conductor traces or catch pads, as discussed above relative to the structure of FIG. 2. It should be appreciated that a generous amount of conductive vias should be utilized and arranged in parallel so as to reduce the inductive effects of the vias. As with the structure of FIG. 2, the structure of FIG. 3 can include the bottom ground plane as the lower most ground plane for the widest strip section.

A consideration in utilizing the ground plane structure of FIG. 2 is better continuity and less inductance between ground planes, while a consideration in utilizing the ground plane structure of FIG. 3 is less metal between the layers which provides for better adhesion between the layers of the unitized multilayer circuit structure.

For purposes of schematic illustration the embedded ground planes are shown as being between contiguous layers, based on the illustrative example that the change in width between contiguous strip sections requires a change in spacing the corresponds to the thickness of one insulating layer. However, the actual spacing depends on the widths of the respective strip sections which are constrained to be at discrete values as determined by the available ground plane depths that are constrained to be integral multiples of layer thickness. Further, depending upon particular requirements, the widths of the strip sections do not have to be all increasing or decreasing in a given direction along the length of the microstrip transmission line. Also, the transition in strip section width does not have to be gradual and the individual changes in width can be relatively large.

Figure 5:
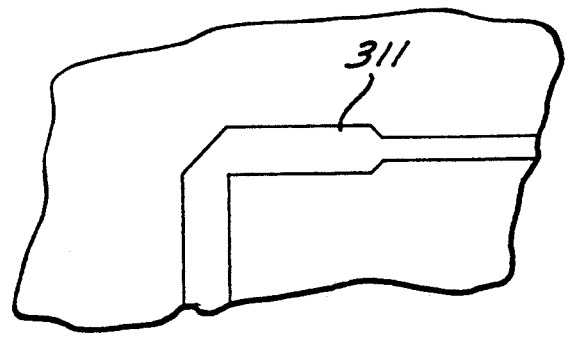
FIG. 5 is a top plan view of a microstrip section with a bend that can be utilized in the microstrip transmission line of the invention.

Referring now to FIGS. 4 and 5, set forth therein are an example of a constant width curved strip section 211 of constant width and an example of a constant width strip section 311 with a bend, which can be utilized in the microstrip transmission line structure in accordance with the invention.

The widths of the ground planes as measured laterally relative to the centerline of the associated strip section line will depend upon the particular application and the possible layout constraints. For example, a ground plane width that is about 3 to 5 times the width of the associated strip section would be appropriate for most cases to avoid finite ground plane effects. If finite ground plane effects cannot be avoided, they can be appropriately compensated. It should be appreciated that the desired width for a ground plane for a curved section or a section having a bend should be satisfied at all points along the length of the strip section.

Pursuant to the transmission line structure of the invention, a substantially constant impedance path is provided between connected strip sections of different widths, which can be advantageously utilized in applications that require a change in microstrip line width, such as connection of a microstrip line of predetermined width to a narrower chip bonding pad 15 as shown in FIG. 1.

Microstrip transmission line structures in accordance with the invention are made, for example, pursuant to low temperature co-fired processing such as disclosed in "Development of a Low Temperature Co-fired Multilayer Ceramic Technology," by William A. Vitriol et al., 1983 ISHM Proceedings, pages 593–598; "Processing and Reliability of Resistors Incorporated Within Low Temperature Co-fired Ceramic Structures," by Ramona G. Pond et al., 1986 ISHM Proceedings, pages 461–472; and "Low Temperature Co-Fireable Ceramics with Co-Fired Resistors," by H. T. Sawhill et al., 1986 ISHM Proceedings, pages 268–271.

In accordance with low temperature co-fired processing, vias are formed in a plurality of green thick film tape layers at locations defined by the desired via configurations of the desired multilayer circuit. The vias are filled with the appropriate fill material, for example, by screen printing. Conductor metallization for conductive traces including the embedded ground planes are then deposited on the individual tape layers by screen printing, for example, and materials for forming passive components are deposited on the tape layers. The tape layers are laminated and fired at a temperature below 1200 degrees Celsius (typically 850 degrees Celsius) for a predetermined length of time which drives off organic materials contained in the green ceramic tape and forms a solid ceramic substrate. External metallization including the microstrip sections of different widths, a lower ground plane metallization and any side wall metallization can then be applied by known techniques.

Although the foregoing has been a description and illustration of specific embodiments of the invention, various modifications and changes thereto can be made by persons skilled in the art without departing from the scope and spirit of the invention as defined by the following claims.

What is claimed is:

1. A microstrip transmission line structure formed in a unitized multilayer circuit structure having a plurality of insulating layers, the microstrip transmission line structure comprising:
   a series of connected microstrip strip sections having different widths disposed on an outside layer of the unitized multilayer circuit structure and forming a microstrip line;
   respective ground planes for each of said strip sections formed between insulating layers and respectively spaced from the associated strip sections to provide a substantially constant impedance along the length of the microstrip line; and
   a plurality of conductive vias for electrically interconnecting said respective ground planes.

2. The microstrip transmission line structure of claim 1 wherein each of said ground planes extends beneath an overlying ground plane if present.

3. The microstrip transmission line structure of claim 1 wherein one or more of said strip sections include a curved strip section.

4. The microstrip transmission line structure of claim 1 wherein one or more of said strip sections comprises a strip section with a bend.

5. A microstrip transmission line structure formed in a unitized multilayer circuit structure having a plurality of insulating layers, the microstrip transmission line structure comprising:
   a series of connected microstrip strip sections having different widths disposed on an outside layer of the unitized multilayer circuit structure and forming a microstrip line;
   respective ground planes for each of said strip sections respectively spaced from the associated strip sections to provide a substantially constant impedance along the length of the microstrip line, the lowermost ground plane being formed on the bottom of the unitized multilayer circuit structure and the other ground planes being formed between insulating layers; and
   a plurality of conductive vias for electrically interconnecting said respective ground planes.

6. The microstrip transmission line structure of claim 5 wherein one or more of said strip sections include a curved strip section.

7. The microstrip transmission line structure of claim 5 wherein one or more of said strip sections comprises a strip section with a bend.

* * * * *